(12) United States Patent
Kang

(10) Patent No.: US 9,873,954 B2
(45) Date of Patent: Jan. 23, 2018

(54) EPITAXIAL WAFER AND METHOD FOR FABRICATING THE SAME

(71) Applicant: LG INNOTEK CO., LTD., Seoul (KR)

(72) Inventor: Seok Min Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/406,070

(22) PCT Filed: Oct. 29, 2013

(86) PCT No.: PCT/KR2013/009645
§ 371 (c)(1),
(2) Date: Dec. 5, 2014

(87) PCT Pub. No.: WO2014/069859
PCT Pub. Date: May 8, 2014

(65) Prior Publication Data
US 2015/0259828 A1 Sep. 17, 2015

(30) Foreign Application Priority Data

Oct. 31, 2012 (KR) .................. 10-2012-0122007

(51) Int. Cl.
*C30B 25/20* (2006.01)
*C30B 29/36* (2006.01)
(Continued)

(52) U.S. Cl.
CPC .......... *C30B 25/20* (2013.01); *C23C 16/0272* (2013.01); *C23C 16/325* (2013.01);
(Continued)

(58) Field of Classification Search
CPC ........... H01L 29/1608; H01L 29/66068; H01L 29/1602; H01L 29/7802; H01L 29/6606;
(Continued)

(56) References Cited

U.S. PATENT DOCUMENTS

| 5,187,547 | A  | * | 2/1993  | Niina     | H01L 33/0054 257/103 |
| 6,198,141 | B1 | * | 3/2001  | Yamazaki  | B82Y 10/00 257/310 |
| 6,734,461 | B1 | * | 5/2004  | Shiomi    | C30B 23/00 257/194 |
| 2002/0025660 | A1 | * | 2/2002  | Boydston  | C30B 25/18 438/503 |
| 2007/0072398 | A1 | * | 3/2007  | Shibata   | H01L 29/045 438/478 |
| 2009/0155947 | A1 | * | 6/2009  | Paek      | H01L 21/0242 438/46 |
| 2009/0302328 | A1 | * | 12/2009 | Ohno      | H01L 21/02378 257/77 |
| 2010/0119849 | A1 |   | 5/2010  | Nakamura et al. | |
| 2010/0252834 | A1 | * | 10/2010 | Lee       | H01L 21/0242 257/76 |

(Continued)

FOREIGN PATENT DOCUMENTS

JP    2007-119273 A    5/2007
JP    2010-225733 A    10/2010
(Continued)

OTHER PUBLICATIONS

Search Report for International Application No. PCT/KR2013/009645.

*Primary Examiner* — Allen Parker
*Assistant Examiner* — Long H Le
(74) *Attorney, Agent, or Firm* — LRK Patent Law Firm

(57) ABSTRACT

Provided are an epitaxial wafer and a method of fabricating the same. The method includes a pre-growth step of injecting a reaction source for epitaxial growth on a semiconductor wafer prepared in a chamber and growing an epitaxial layer by a predetermined first thickness at a predetermined first growth rate and at a predetermined first growth temperature, a heat treatment step of performing heat treatment on the epitaxial layer grown by the pre-growth step during a predetermined time, and a subsequent growth step of injecting the reaction source on the heat-treated semiconductor wafer and growing the epitaxial layer to a target thickness at a predetermined second growth rate and at a predetermined second growth temperature. The first growth rate is smaller than the second growth rate.

2 Claims, 3 Drawing Sheets

(51) Int. Cl.
    *C30B 25/10*     (2006.01)
    *H01L 21/02*     (2006.01)
    *H01L 29/16*     (2006.01)
    *C23C 16/02*     (2006.01)
    *C23C 16/32*     (2006.01)
    *C30B 25/16*     (2006.01)
    *C30B 31/22*     (2006.01)

(52) U.S. Cl.
    CPC .............. *C30B 25/10* (2013.01); *C30B 25/16* (2013.01); *C30B 29/36* (2013.01); *C30B 31/22* (2013.01); *H01L 21/0262* (2013.01); *H01L 21/02378* (2013.01); *H01L 21/02529* (2013.01); *H01L 29/1608* (2013.01)

(58) Field of Classification Search
    CPC ......... H01L 21/02378; H01L 21/02529; H01L 21/0262; C30B 25/10; C30B 25/16; C30B 29/36; C30B 31/22
    See application file for complete search history.

(56) References Cited

U.S. PATENT DOCUMENTS

2011/0059003 A1*   3/2011   Sudarshan .............. C30B 25/10
                                                                423/345
2011/0312161 A1*  12/2011   Hamano ................. C30B 25/02
                                                                438/478

FOREIGN PATENT DOCUMENTS

KR     10-1999-0016925 A     3/1999
KR     10-2008-0102065 A    11/2008

* cited by examiner

EPITAXIAL WAFER AND METHOD FOR FABRICATING THE SAME

TECHNICAL FIELD

The present invention relates to a method of fabricating an epitaxial wafer, and more particularly, to an epitaxial wafer in which surface defect density is reduced and doping uniformity is improved, and a method of fabricating the same.

BACKGROUND ART

Generally, epitaxial growth includes a chemical vapor deposition process and a substrate such as a single crystal silicon wafer is heated while a silicon compound in a gaseous, liquid, or solid state is transferred through a surface of the substrate and affects thermal decomposition or decomposition. When the single crystal silicon wafer is used for the substrate, silicon is stacked by continuously growing a single crystal structure. Thus, defects such as a cohesion silicon self-gap defect, or the like, which exist on the surface of the substrate, may directly affect quality of an epitaxial wafer. In the effect on the quality, the defects which exist on the surface of the substrate is continuously grown together with continuously growing the single crystal structure, and thus this may cause forming of a new crystal defect, that is, a growth defect in an epitaxial layer. For example, a surface defect such as an epitaxial stacking defect and a hillock in a range of about 0.1 microns to 10 microns may be formed. Therefore, a method and process of fabricating a substrate which does not substantially have such a surface defect problem is required in an epitaxial growth process.

Further, it is important that the doped epitaxial wafer has doping uniformity from a center to an edge, which meets a desired range according to the design specifications. Therefore, a method and process of fabricating the epitaxial wafer capable of improving the doping uniformity is required.

DISCLOSURE

Technical Problem

The present invention is directed to providing a high quality epitaxial wafer, in which surface defect density is reduced, doping uniformity is improved, and thus characteristics and yield are improved, and a method of fabricating the same.

Technical Solution

One aspect of the present invention provides a method of fabricating of an epitaxial wafer, the method including: a pre-growth step of injecting a reaction source for epitaxial growth on a semiconductor wafer prepared in a chamber and growing an epitaxial layer by a predetermined first thickness at a predetermined first growth rate and at a predetermined first growth temperature; a heat treatment step of performing heat treatment on the epitaxial layer grown by the pre-growth step during a predetermined time; and a subsequent growth step of injecting the reaction source on the heat-treated semiconductor wafer and growing the epitaxial layer to a target thickness at a predetermined second growth rate and at a predetermined second growth temperature, and the first growth rate is smaller than the second growth rate.

In an embodiment, the first growth temperature may be lower than the second growth temperature.

In another embodiment, the semiconductor wafer may be a silicon carbide wafer and the reaction source may be a solid, liquid, or gaseous material including carbon and silicon.

In still another embodiment, the second growth temperature may be set within a range of 1500° C. to 1700° C., and the first growth temperature may be set within a range of 1500° C. to 1700° C., the second growth rate may be set to 20 μm/h or more and the first growth rate is set to 5 μm/h or less, and the first thickness may be set within a range of 0.5 μm to 1 μm.

In yet another embodiment, a heat-treatment temperature in the heat treatment step may be set within a range of 1500° C. to 1700° C.

Advantageous Effects

According to the exemplary embodiment of the present invention, a high quality epitaxial wafer, in which surface defect density is reduced, doping uniformity is improved, and thus characteristics and yield are improved, can be fabricated.

MODES OF THE INVENTION

Figure 1:
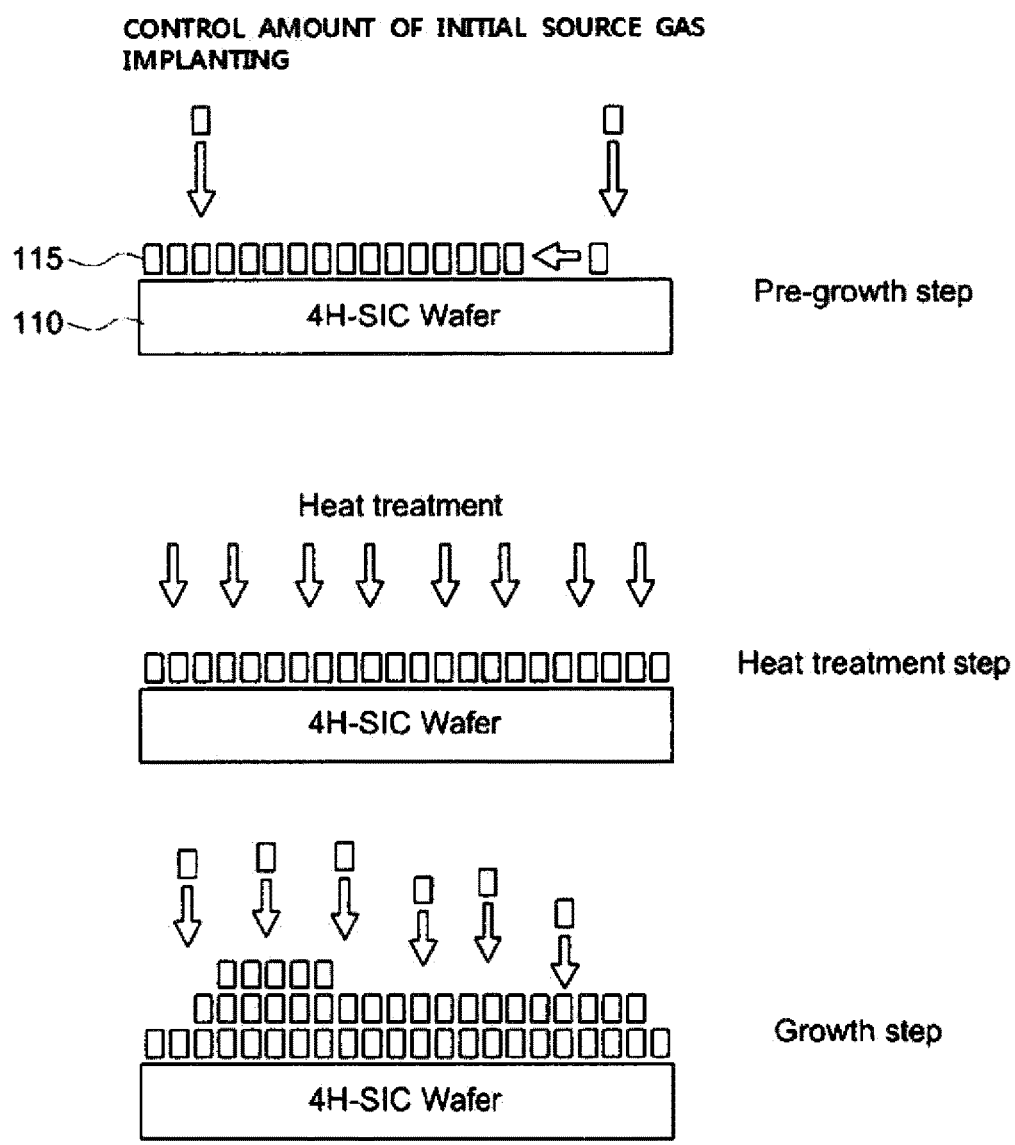
FIG. 1 is a view for describing a process of fabricating an epitaxial wafer according to an exemplary embodiment of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

When it is deemed that detailed descriptions of related well-known functions and configurations might obscure the subject matter of the embodiments, those detailed descriptions will be omitted. Further, the terms (e.g., first, second, etc.) used herein are only used to distinguish one element from another.

The present invention provides a method capable of reducing surface defect density of a fabricated epitaxial wafer. The surface defect density of the epitaxial wafer may be changed by variables such as a flux of reaction gas which is injected in an initial stage, a growth temperature, pressure, a total flux, a C/Si ratio, a $Si/H_2$ ratio, etc. The present invention provides a method for reducing the surface defect density to $0.5/cm^2$ or less (i.e., 0.5 defects per 1 $cm^2$ or less). To this end, the present invention uses a method of controlling a growth temperature, a growth rate (i.e., a flux of reaction gas which is injected), a thickness of an epitaxial layer to be grown in a pre-growth step, and a C/Si ratio.

Further, doping uniformity may also be improved by the method of fabricating the epitaxial wafer according to the embodiment of the present invention. This may be clearly understood through detailed descriptions of the following accompanying drawings.

Figure 2:
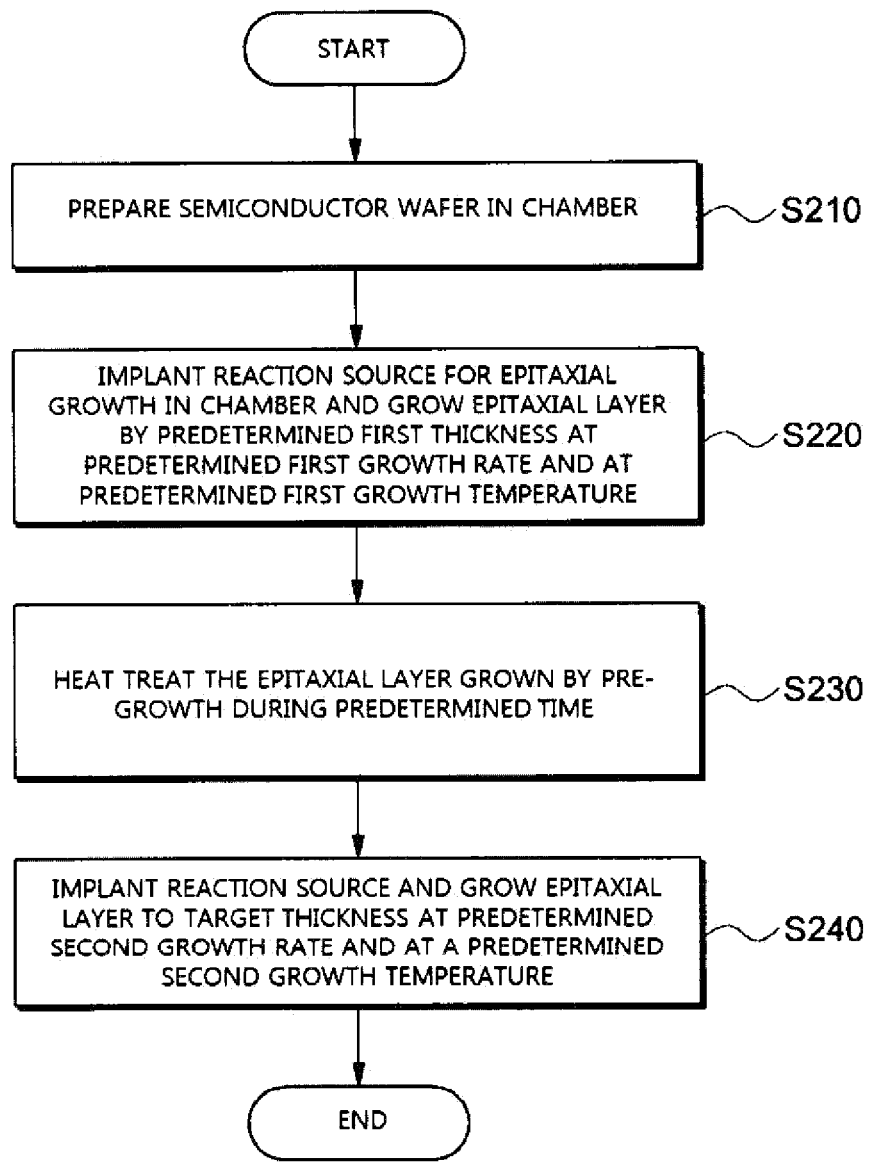
FIG. 2 is a flowchart showing a method of fabricating an epitaxial wafer according to an exemplary embodiment of the present invention.
Figure 3:
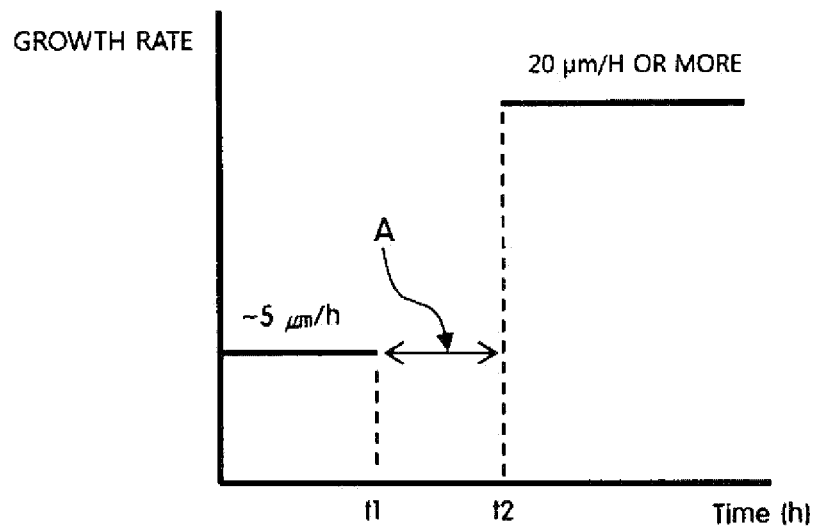
FIG. 3 is a graph showing an example of a growth condition in the method of fabricating the epitaxial wafer according to the exemplary embodiment of the present invention.

FIG. 1 is a view for describing a process of fabricating an epitaxial wafer according to an exemplary embodiment of the present invention and FIG. 2 is a flowchart showing the method of fabricating the epitaxial wafer according to the exemplary embodiment of the present invention. FIG. 3 is a graph showing an example of a growth condition in the method of fabricating the epitaxial wafer according to the exemplary embodiment of the present invention.

Hereinafter, the method of fabricating the epitaxial wafer according to the exemplary embodiment of the present invention will be described in detail with reference to FIGS. 1 and 3 based on the flowchart of FIG. 2.

Referring to FIG. 2, in the exemplary embodiment of the present invention, a semiconductor wafer 110 (see FIG. 1) is prepared in a reaction chamber (S210), and then a pre-growth step (see FIG. 1) is performed (S220).

Referring to FIG. 1, although a silicon carbide based wafer (a 4H-SiC wafer) is illustrated, the wafer may be different according to a device or a product to be finally fabricated.

Before a process of stacking a particular material on the above-described semiconductor wafer is performed, it is difficult to secure stack reliability due to a lattice constant mismatch problem between the stacked layers. To reduce this problem, a method in which an epitaxial layer 115 (see FIG. 1) may serve as a kind of a buffer layer by stacking (growing) the epitaxial layer 115 on the semiconductor wafer is widely used.

However, a surface defect may be generated in the growth process of the epitaxial layer, the semiconductor wafer is not relevant to use as a substrate of the product when the surface defect is greater than or equal to an allowable value (generally, when surface defect density is more than $1/cm^2$). Therefore, in the exemplary embodiment of the present invention, the pre-growth step in S220 of FIG. 2 is used as a method of reducing the surface defect density to $0.5/cm^2$ or less.

According to the exemplary embodiment of the present invention, the pre-growth step is performed at a growth rate (hereinafter, referred to as a first growth rate) smaller than a growth rate (hereinafter, referred to as a second growth rate) in a subsequent growth step in S240. Further, the pre-growth step may be performed at a growth temperature (hereinafter, referred to as a first growth temperature) lower than a growth temperature (hereinafter, referred to as a second growth temperature) in the subsequent growth step in S240.

For example, when the growth temperature in the subsequent growth step is set within a range of 1500° C. to 1700° C., the growth temperature in the pre-growth step may be set within a range of 1400° C. to 1500° C.

That is, the pre-growth step is a process of growing the epitaxial layer on the semiconductor wafer at the first growth rate smaller than the second growth rate and at the first growth temperature lower than the second growth temperature when a reaction source for an epitaxial growth is injected into a reaction chamber.

Here, the reaction source is different according to a material or type of the semiconductor wafer which is an object of the epitaxial layer to be stacked. For example, when the semiconductor wafer 110 is a silicon carbide based wafer as shown in FIG. 1, a solid, liquid, or gaseous material containing silicon compound such as $SiH_4+C_3H_8+H_2$, MTS ($CH_3SiCl_3$), TCS($SiHCl_3$), $Si_xC_x$, or the like, which are materials capable of matching lattice constant, may be used as the reaction source.

In this case, for example, the first growth rate may be set to 5 μm/h or less (i.e., a rate in which the epitaxial layer is stacked to have a thickness in a range of 5 μm or less per an hour). Here, the growth rate may be controlled by controlling a flux of a reaction source implanted in the chamber.

Generally, in the case in that the epitaxial growth is performed at a fast growth rate, the uniform stacking (growing) of the epitaxial layer may be difficult. Therefore, in the above-described pre-growth step, as a predetermined growth temperature is maintained, mobility between atoms by the reaction source is increased and an environment capable of uniformly growing is prepared. Then, as the growth rate is reduced, time in which the atoms are uniformly distributed and grown on the semiconductor wafer is granted. Further, dislocation density formed inside the epitaxial layer may be reduced.

Therefore, lattice mismatch is reduced by performing the pre-growth step and thus surface defects may be reduced. Therefore, since the above-described pre-growth step is a pre-process to assist the subsequent growth step by reducing the surface defects according to the lattice mismatch in an initial growth stage, a thickness of the epitaxial layer grown by the pre-growth step may be sufficient to set within a range of approximately 0.5 μm to 1.0 μm.

Here, the thickness of the epitaxial layer grown by the pre-growth step may be controlled by controlling the growth temperature, the growth rate, and a growth time t1 (see FIG. 3), which were described above.

After the pre-growth step is performed and before the subsequent growth step in S240 is performed, a heat treatment step (see FIG. 1, a time in range of t1 to t2 of FIG. 3, that is, a reference numeral A of FIG. 3) in S230 is performed. The heat treatment step is a process inserted between the above-described pre-growth step and the subsequent growth step to be described below in order to improve doping uniformity of the epitaxial layer to be fabricated according to the exemplary embodiment of the present invention.

Generally, a process of doping the epitaxial layer to be grown with an N-type or a P-type may be simultaneously performed in the process of growing the epitaxial layer. The doping type is determined according to use of the epitaxial wafer, purpose, and the like, and this is possible to include doping gas which is required for N-type or P-type doping in the reaction gas. However, doping particles of particular polarity are not fully substituted with elements of Group 4 included in the epitaxial layer and may remain only in a state of being penetrated in the epitaxial layer.

Therefore, in the exemplary embodiment of the present invention, the heat treatment step in S230 is inserted after the pre-growth step and before the subsequent growth step, and thus a method in which doping uniformity of the finally fabricated epitaxial wafer is also improved is used.

When the heat treatment step is inserted, time and energy capable of substituting the doping particles maintained in the epitaxial layer grown in the pre-growth step in the simple penetration state with the elements of Group 4 are granted in a heat treatment environment at a high temperature, and thus total doping uniformity of the finally fabricated epitaxial wafer may be improved.

The above-described heat treatment step is performed during a predetermined time and then the subsequent growth step in S240 is performed again. Here, since the subsequent growth step is a process of mainly performing epitaxial growth and a growth process after the pre-growth step is already performed, the epitaxial growth may be performed at a very fast rate compared to the growth rate of the pre-growth step.

For example, the subsequent growth step in S240 may be performed at a rate of 20 μm/h or more as shown in FIG. 3. Further, for example, the growth temperature (i.e., the second growth temperature) in the subsequent growth step may be set within a range of 1500° C. to 1700° C. as described above. The subsequent growth step may be performed until a total thickness of the epitaxial layer becomes a target thickness to be grown. In this case, the target thickness may be changed by purpose of the epitaxial wafer, usage, natures of the final device and the product, design values, etc.

As described above, the method of fabricating the epitaxial wafer according to the exemplary embodiment of the present invention, which performs the subsequent growth step after the pre-growth step is performed at a very low growth rate, has an advantage in which processing time and cost may be reduced in addition to reduction of surface defect density compared to the conventional technique.

In the case of the conventional technique, since the pre-growth step according to the exemplary embodiment of the present invention is not included, the epitaxial layer has been grown at the low growth rate in a range of about 8 μm/h to 10 μm/h to avoid a surface defect density problem. To this end, a complex process of polishing the epitaxial layer again to a target thickness was performed after excessively growing to have a thickness of 50 μm.

On the other hand, according to the exemplary embodiment of the present invention, since the surface defect density problem is removed after the pre-growth step, a growth process may be performed at a very fast growth rate in the subsequent growth step. Since an additional polishing process is not needed, total processing time and cost may be greatly reduced.

Figure 4:
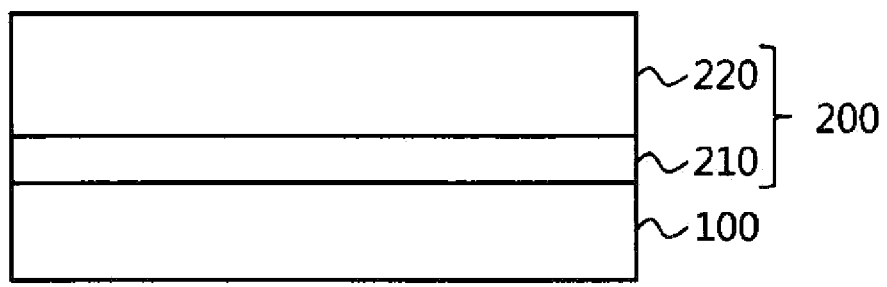
FIG. 4 is a conceptual view showing an epitaxial wafer according to an exemplary embodiment of the present invention.

FIG. 4 is a conceptual view showing an epitaxial wafer according to an exemplary embodiment of the present invention.

The epitaxial wafer according to the exemplary embodiment of the present invention includes a substrate 100 and an epitaxial structure 200 formed on the substrate 100. The substrate 100 may include a silicon carbide based wafer and the epitaxial structure 200 may also include a silicon carbide structure.

More specifically, the epitaxial structure 200 includes a first epitaxial layer 210 formed on the substrate 100 and a second epitaxial layer 220 formed on the first epitaxial layer 210.

The first epitaxial layer 210 is formed on the substrate 100 by the above-described pre-growth step, and thus may serve to reduce a leakage current when a voltage is applied. In this case, the first epitaxial layer 210 may have a thickness in a range of 1 μm or less.

The second epitaxial layer 220 may be fabricated to have a target thickness and to have surface defect density in a range of 0.5 cm$^2$ or less by the subsequent growth step.

In this case, both the first epitaxial layer 210 and the second epitaxial layer 220 may include N-type conductive silicon carbide series. That is, when the substrate 100 includes silicon carbide (SiC), the first epitaxial layer 210 and the second epitaxial layer 220 may be formed of silicon carbide nitride (SiCN).

However, it is not limited thereto, both the first epitaxial layer 210 and the second epitaxial layer 220 may include P-type conductive silicon carbide series. In this case, the first epitaxial layer 210 and the second epitaxial layer 220 may be formed of aluminum silicon carbide (AlSiC).

The above-described epitaxial wafer may be applied to a metal-semiconductor field effect transistor (MESFET). For example, an ohmic contact layer including a source and a drain is formed on the second epitaxial layer 220 according to the exemplary embodiment of the present invention, and thus the MESFET may be fabricated. In addition to, the epitaxial wafer may be applied to various semiconductor devices.

While the present invention has been described with reference to exemplary embodiments, it will be understood by those skilled in the art that various changes and modifications may be made without departing from the spirit and scope of the present invention as defined by the appended claims.

The invention claimed is:

1. A method of fabricating an epitaxial wafer, comprising:
a pre-growth step of injecting a reaction source for epitaxial growth on a semiconductor wafer prepared in a chamber and growing a first epitaxial layer by a predetermined first thickness at a predetermined first growth rate, at a predetermined first growth time and at a predetermined first growth temperature;
a heat treatment step of performing heat treatment on the first epitaxial layer to increase uniformity of a dopant of the first epitaxial layer; and
a subsequent growth step of injecting the reaction source on the heat-treated semiconductor wafer and growing a second epitaxial layer to a target thickness at a predetermined second growth rate, at a predetermined second growth time and at a predetermined second growth temperature,
wherein the first growth rate is smaller than the second growth rate and the first growth temperature is lower than the second growth temperature to decrease dislocation density of the first epitaxial layer,
wherein the first growth time is shorter than the second growth time,
wherein the first growth rate is set to 5 μm/h or less and the second growth rate is set to 20 μm/h or more,
wherein the first growth temperature is set, within a range of 1400° C. to 1500° C. and the second growth temperature is set within a range of 1500° C. to 1700° C.,
wherein the heat treatment step is inserted, between the pre-growth step growing the first epitaxial layer on the semiconductor wafer and the subsequent growth step growing the second epitaxial layer on the first epitaxial layer,
wherein a thickness of the second epitaxial layer is larger than the first thickness,
wherein the first and the second epitaxial layers have the same dopant, and
wherein a heat-treatment temperature in the heat treatment step is higher than the first growth temperature and is the same as the second growth temperature which is set within a range of 1500° C. to 1700° C.

2. The method of claim 1, wherein the semiconductor wafer is a silicon carbide wafer and the reaction, source is a solid, liquid, or gaseous material including carbon and silicon.

* * * * *